(12) United States Patent
Khawshe et al.

(10) Patent No.: US 7,280,574 B1
(45) Date of Patent: Oct. 9, 2007

(54) CIRCUIT FOR DRIVING A LASER DIODE AND METHOD

(75) Inventors: Vijay Khawshe, Bangalor (IN); Gajender Rohilla, RT Nagar (IN)

(73) Assignee: Cypress Semiconductor Corp., San Jose, CA (US)

( * ) Notice: Subject to any disclaimer, the term of this patent is extended or adjusted under 35 U.S.C. 154(b) by 106 days.

(21) Appl. No.: 10/146,560

(22) Filed: May 15, 2002

(51) Int. Cl.
 *H01S 3/00* (2006.01)
(52) U.S. Cl. .................. 372/38.02; 372/38.07
(58) Field of Classification Search ........... 372/38.02, 372/38.07, 38.04
 See application file for complete search history.

(56) References Cited

U.S. PATENT DOCUMENTS

| | | | |
|---|---|---|---|
| 4,733,398 A * | 3/1988 | Shibagaki et al. ....... | 372/38.02 |
| 5,729,154 A * | 3/1998 | Taguchi et al. ................ | 326/30 |
| 5,764,667 A | 6/1998 | Luque .......................... | 372/38 |
| 5,907,569 A * | 5/1999 | Glance et al. ......... | 372/29.021 |
| 6,266,078 B1 * | 7/2001 | Koga et al. .................. | 347/236 |
| 6,285,692 B1 * | 9/2001 | Okayasu ................... | 372/38.02 |
| 6,532,245 B1 * | 3/2003 | Paschal et al. ........... | 372/38.02 |
| 6,535,534 B1 * | 3/2003 | Fischer ..................... | 372/38.02 |
| 6,618,406 B1 * | 9/2003 | Kaminishi ................ | 372/38.02 |
| 6,819,876 B2 * | 11/2004 | Okayasu et al. ............ | 398/182 |

* cited by examiner

*Primary Examiner*—Armando Rodriguez
(74) *Attorney, Agent, or Firm*—Dale B. Halling

(57) ABSTRACT

A circuit for driving a laser diode has a variable bias circuit. The variable bias circuit has an output designed to couple to the laser diode. A modulation circuit has an output designed to couple to the laser diode.

17 Claims, 2 Drawing Sheets

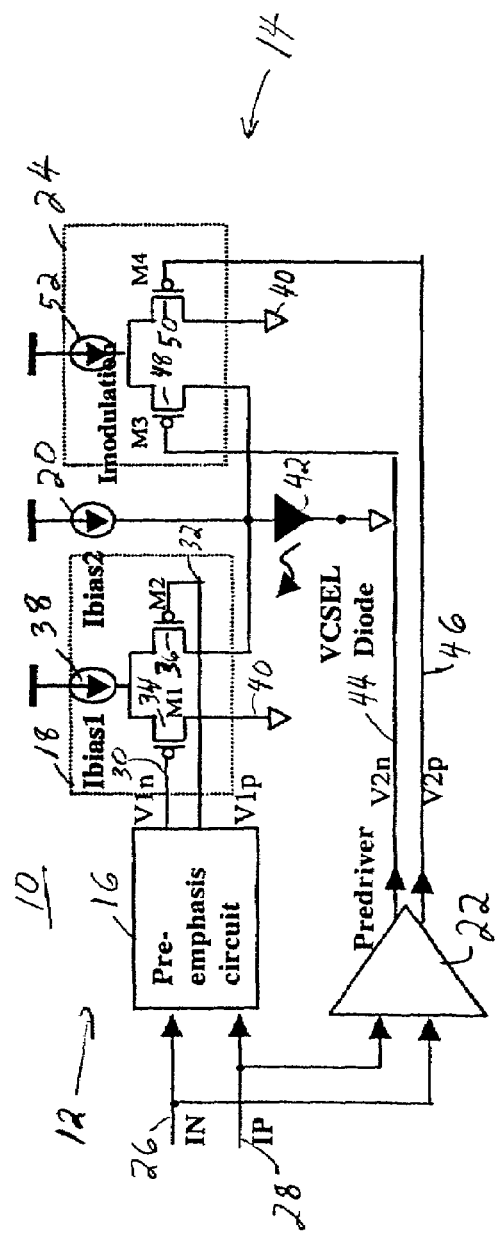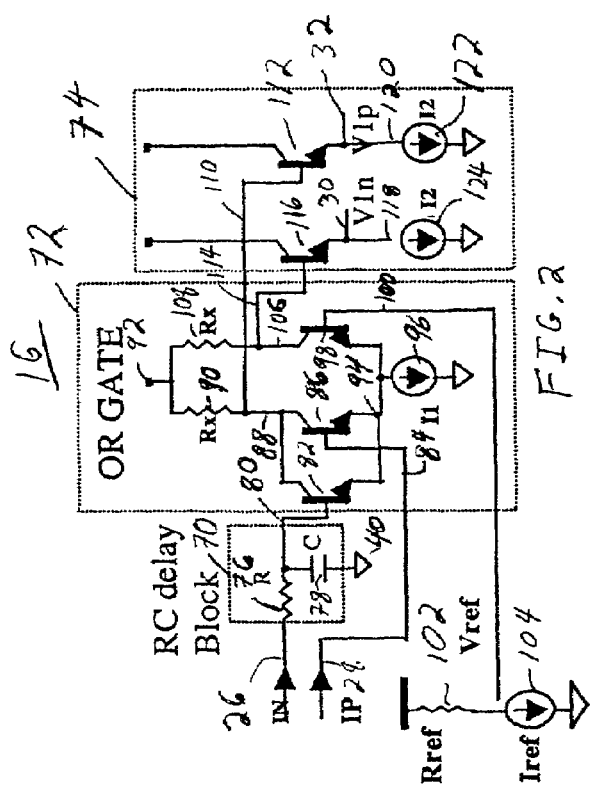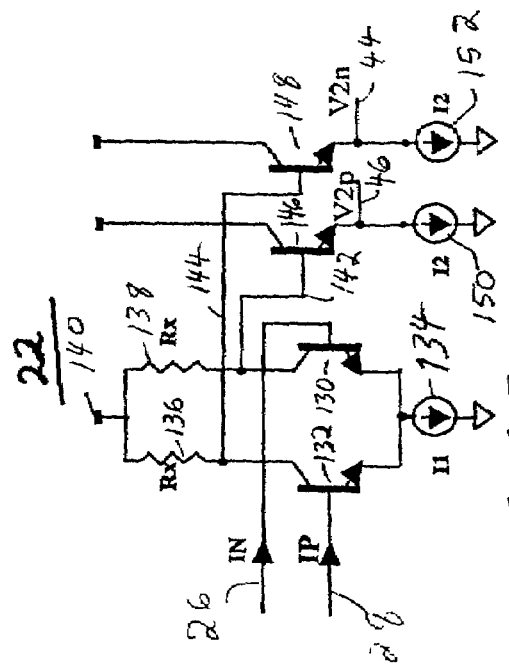

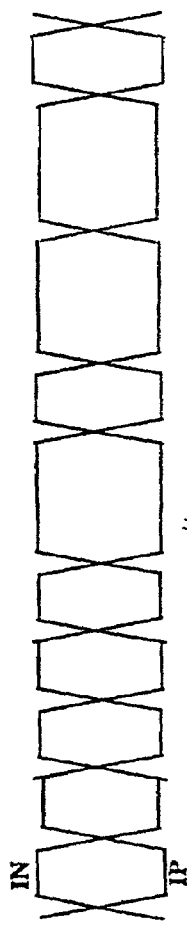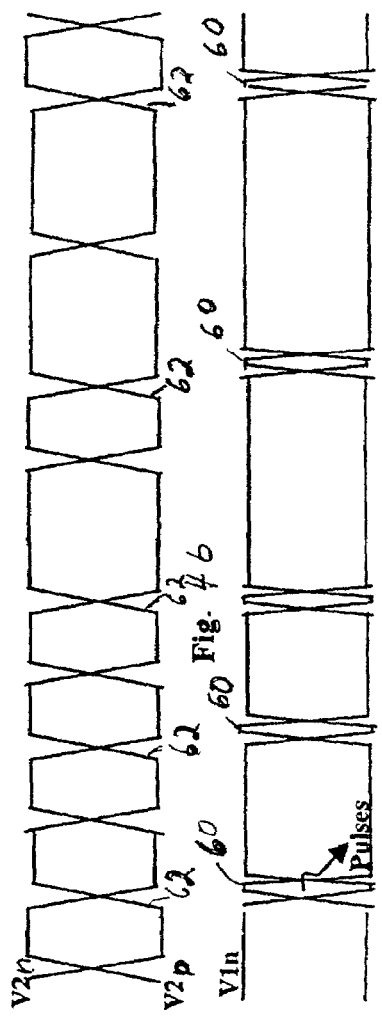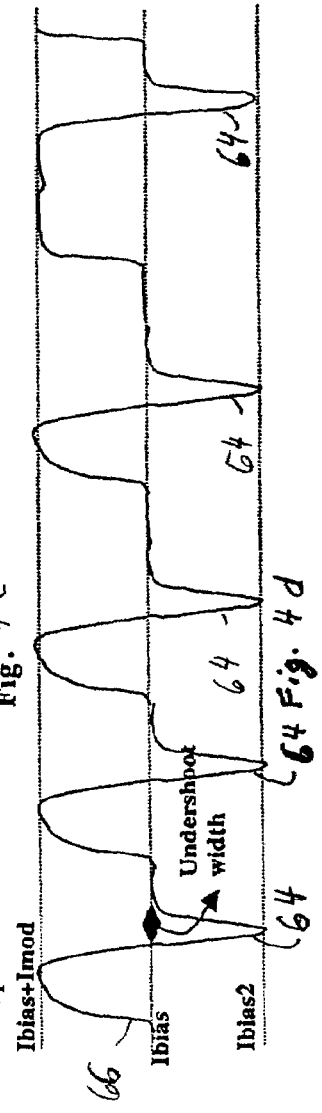
Fig. 4a
Fig. 4b
Fig. 4c
Fig. 4d

CIRCUIT FOR DRIVING A LASER DIODE AND METHOD

FIELD OF THE INVENTION

The present invention relates generally to the field of electronic circuits and more particularly to a circuit for driving a laser diode and method.

BACKGROUND OF THE INVENTION

Laser diodes, and particularly Vertical Cavity Surface Emitting Laser (VCSEL) diodes, are used for data transmission on optical links. Prior art drivers provide a bias current to the laser diodes. A modulation current then turns the laser diode on and off. The rise and fall times of the modulation current to the laser diode are equal. Unfortunately, the laser diode is faster to respond to a rising edge than a falling edge. As a result, there is a mismatch in the rise and fall times of the output optical pulse. This asymmetrical shape may degrade the bit error rate of the optical communication link and cause other problems.

Thus there exists a need for a circuit for driving a laser diode that provides equal rise and fall times on the output optical pulse.

SUMMARY OF INVENTION

A circuit for driving a laser diode has a variable bias circuit. The variable bias circuit has an output designed to couple to the laser diode. A modulation circuit has an output designed to couple to the laser diode. By having a variable bias circuit the bias current may be reduced during the fall time of a modulation current. This decreases the fall time of the optical output signal and may equalize the rise time and fall time of the optical signal. The invention may have applications in driving other devices with unequal rise and fall time responses.

BRIEF DESCRIPTION OF THE DRAWINGS

FIG. 1 is a block and circuit diagram of a circuit for driving a laser diode in accordance with one embodiment of the invention;

FIG. 2 illustrates a circuit diagram of the pre-emphasis circuit in accordance with one embodiment of the invention;

FIG. 3 is a circuit diagram of the predriver in accordance with one embodiment of the invention; and FIGS. 4a-d are signal diagrams for the circuit of FIG. 1 in accordance with one embodiment of the invention.

DETAILED DESCRIPTION OF THE DRAWINGS

A circuit and method for driving a laser diode provides a variable amount of bias current to the laser diode. The variable bias current is used to reduce or eliminate the unequal response of the laser diode and particularly VCSEL laser diodes. The invention may have applications in driving other devices with unequal rise and fall time responses.

FIG. 1 is a block and circuit diagram of a circuit 10 for driving a laser diode in accordance with one embodiment of the invention. The circuit 10 is composed of two main parts, a variable bias circuit 12 and a modulation circuit 14. The variable bias circuit includes the pre-emphasis circuit 16, the bias switch circuit 18 and the second bias current source 20. The modulation circuit 14 includes the predriver 22 and the modulation switching circuit 24. The circuit is driven by a differential input, IN 26 and IP 28. An example of these signals is shown in FIG. 4a. The differential input signals 26, 28 are coupled to the pre-emphasis circuit 16. The pre-emphasis circuit may also be called a bias control circuit of first bias control circuit. The pre-emphasis circuit 16 has a pair of differential outputs $V_{1n}$ 30 and $V_{1p}$ 32. The differential outputs 30, 32 are coupled to a gate of a pair of transistors 34, 36. The sources of the pair of transistors 34, 36 are coupled to the first bias current source 38. One of the pair of transistors 34 has a drain coupled to ground 40. The second of the pair of transistors 36 has a drain coupled to the laser diode 42. The second pair of transistor may form a bias switch. The second bias current source 20 is also connected to the laser diode 42. The second bias current source 20 is always biasing the laser diode 42. While the first bias current source 38 is selectively applied to the laser diode 42.

The predriver, also called a modulation control circuit, 22 is also connected to the differential input signals 26, 28. The output of the predriver 22 is a pair of differential signals $V_{2n}$ 44 and $V_{2p}$ 46. The differential signals 44, 46 are coupled to a gate of a pair of transistors 48, 50. The sources of the pair of transistors 48, 50 are coupled to a modulation current source 52. One of the pair of transistors 50 has a drain coupled to a ground 40. A second of the pair of transistors 48 has a drain coupled to the laser diode 42. The second pair of transistor 48 form a modulation switch.

The operation of the circuit will be described in conjunction with the signal diagrams of FIGS. 4a-4d. The input differential signals IN 26 and IP 28 (shown in FIG. 4a) are coupled to the pre-emphasis circuit 16 and the predriver 22. The outputs of the predriver 22 are $V_{2n}$ 44 and $V_{2p}$ 46 (See FIG. 4b). These signals are essentially the same as the input signals IN 26 and IP 28, but are slightly delayed and inverted. As the input signal IN 26 goes high the predriver output signal $V_{2n}$ 44 goes low with a small delay (See FIG. 4b). This signal 44 is coupled to the transistor 48, which is then on (i.e., closed). As a result the modulation current 52 flows into the laser diode 42. When the predriver output signal $V_{2n}$ 44 goes high and its pair signal $V_{2p}$ 46 goes low the transistor 48 is off (open) and the transistor 50 is on (closed). As result the modulation current 52 is coupled to ground.

The outputs of the pre-emphasis circuit 16 are $V_{1n}$ 30 and $V_{1p}$ 32 (See FIG. 4c). The signal $V_{1n}$ 30 is high most of the time except during a period labeled pulse 60. When the signal $V_{1n}$ 30 is high the transistor 34 is off (open) and the current from the first bias current source flows through the transistor 36 to the laser diode. The transistor 36 is on (closed) since the signal $V_{1p}$ 32 is low. When the pulse 60 occurs signal $V_{1n}$ 30 is low and the transistor 34 is on (closed). While the signal $V_{1p}$ 32 is high and the transistor 36 is off (open). As a result the first bias current source 38 is coupled to ground 40. Thus there is a short period during which the laser diode 42 only receives current from the second bias current source 20. The pulse 60 occurs when predriver output signal $V_{2n}$ 44 transitions high 62, which corresponds with turning off the transistor 48 and therefor turning off the modulation current source 52. The sum of the currents being applied to the laser diode 42 is shown in FIG. 4d. The FIG. 4d clearly shows that the bias current is temporarily reduced during the falling edge 64 of the signal 66. This reduction in the bias current results in a faster fall time for the laser diode 42.

FIG. 2 illustrates a circuit diagram of the pre-emphasis circuit 16 in accordance with one embodiment of the invention. The pre-emphasis circuit 16 has three major parts, a delay block also called a delay circuit 70, an OR gate 72 and a pair of emitter followers 74. The delay block 70 has a resistor 76 coupled to the input signal IN 26. A capacitor 78 is coupled between the other end of the resistor 76 and ground 40. The delay output 80 of the delay block 70 is coupled to the OR gate 72. The delay output 80 is coupled to a base of a transistor 82. The input signal IP 28 is coupled to a base 84 of a transistor 86. The collectors 88 of the transistors 82, 86 are coupled through a resistor 90 to a supply voltage 92. The emitters 94 of the transistor 82, 86 are coupled to a current source 96. A third transistor 98 has a base 100 coupled to a reference resistor 102 and reference current source 104. A collector 106 of the transistor 98 is coupled to through a resistor 108 to a supply voltage 92. The emitter 94 of the transistor 98 is coupled to the current source 96.

The first output 110 of the OR gate 72 is coupled to the base of a first transistor 112 of the emitter follower circuit 74. The second output 114 of the OR gate is coupled to the base of a second transistor 116 of the emitter follower circuit 74. The emitters 118, 120 of the transistors 112, 116 are coupled to current sources 122, 124. The outputs 30, 32 of the pre-emphasis circuit 16 are coupled to the emitters 118, 120.

The delay block 70 causes the input signal IN 26 to be delayed slightly. As a result the OR gate has a short period of time in which it has two low signals at its input. As a result, its output 110 is low for that small delay and is high otherwise. This results in the output $V_{1p}$ 32 of the emitter follower being low except during the small delay (pulse). When the output $V_{1p}$ 32 pulses high the output $V_{1n}$ 30 pulses low due to the differential outputs of the OR gate. Vref is set at some level between the peak-to peak voltage levels of IN 26 and IP 28 values. This setting will decide the OR gate output pulse width.

FIG. 3 is a circuit diagram of the predriver 22 in accordance with one embodiment of the invention. The predriver has differential inputs IN 26 and IP 28. The differential inputs 26, 28 are each coupled to a base of a pair of transistors 130, 132. The pair of transistors 130, 132 have their emitters coupled to a current source 134. The collectors of the pair of transistors 130, 132 are coupled through a pair of resistors 136, 138 to a supply voltage 140. The outputs 142, 144 of the pair of transistors 130, 132 are coupled to a pair of emitter followers. The outputs 142, 144 are coupled to a base of a pair of transistors 146, 148. The emitters of the pair of transistors 146, 148 are coupled to a pair of current sources 150, 152. The outputs of the emitter followers are the signals $V_{2n}$ 44 and $V_{2p}$ 46. The predriver's main function is provide a delay (delay circuit) equal to the delay of the pre-emphasis circuit 16.

The process the circuit implements can be generalized. The process involves applying a second bias current to the laser diode. A periodic on-off modulation current is applied to the laser diode. A first bias current is applied to the laser diode except during a selected transition of the periodic on-off modulation current. The selected transition, in one embodiment, is the transition from an on state to an off state of the modulation current.

Thus there has been described a circuit and method for driving a laser diode. The invention uses a variable bias current to offset the asymmetrical response time of the laser diode. This may result in a symmetrical rise and fall time for the output of the laser diode. This can result in improved bit error rates.

While the invention has been described in conjunction with specific embodiments thereof, it is evident that many alterations, modifications, and variations will be apparent to those skilled in the art in light of the foregoing description. For instance, the delay block may be implemented as a delay gate (inverter) or the variable bias current could be provided by a variable current source. Accordingly, it is intended to embrace all such alterations, modifications, and variations in the appended claims.

What is claimed is:

1. A circuit for driving a laser diode, comprising:
a differential input signal;
a variable bias circuit having an output designed to couple to the laser diode and controlled by the differential input signal, wherein the variable bias circuit has a first bias current source having an output designed to be coupled to the laser diode and a second bias current source having an output designed to be coupled to the laser diode; and
a modulation circuit having a single ended output electrically directly coupled to an anode of the laser diode.

2. The circuit of claim 1, further including:
a bias switch coupled to the first bias current source having an output designed to be coupled to the laser diode.

3. The circuit of claim 2, further including a bias control circuit coupled to the bias switch.

4. The circuit of claim 3, wherein an output of the bias control circuit is a true state except when the differential input transitions from a true state to a false state.

5. The circuit of claim 4, wherein the true state of the output of the bias control circuit results in the bias switch being closed.

6. The circuit of claim 1, wherein the modulation circuit comprises:
a modulation current source;
a modulation switch coupled to the modulation current source having an output designed to be coupled to the laser diode.

7. The circuit of claim 6, further including a modulation control circuit coupled to the modulation switch.

8. The circuit of claim 7, further including the differential input coupled to the bias control circuit and the modulation control circuit.

9. The circuit of claim 8, wherein the true state of the differential input results in the modulation switch being closed.

10. A circuit for driving a laser diode, comprising:
a first bias current source having a first output designed to couple to the laser diode and second output coupled to ground;
a second bias current source having an output designed to couple to the laser diode; and
a modulation control circuit having an output electrically directly coupled to an anode to the laser diode and controlled by a differential input signal.

11. The circuit of claim 10, further including a first bias control circuit coupled to the first bias current source.

12. The circuit of claim 11, further including a first bias switch having a gate coupled to the first bias control source.

13. The circuit of claim 11, wherein the first bias control circuit includes a delay circuit.

14. The circuit of claim 11, wherein the first bias control circuit includes an OR gate.

15. The circuit of claim 10, further including a modulation switch coupled to the modulation control circuit.

16. The circuit of claim 15, further including a modulation current source coupled to the modulation switch.

17. The circuit of claim 10, wherein the modulation control circuit includes a delay circuit.

* * * * *